US012447355B2

(12) United States Patent
Pomar et al.

(10) Patent No.: US 12,447,355 B2
(45) Date of Patent: Oct. 21, 2025

(54) DEVICE FOR STIMULATING THE MEIBOMIAN GLANDS

(71) Applicant: Rodolfo Pomar, Pianoro (IT)

(72) Inventors: Rodolfo Pomar, Pianoro (IT); Morena Gomedi, Pianoro (IT)

(73) Assignee: ESPANSIONE MARKETING S.P.A., Centergross Funo (IT)

( * ) Notice: Subject to any disclaimer, the term of this patent is extended or adjusted under 35 U.S.C. 154(b) by 415 days.

(21) Appl. No.: 17/286,314

(22) PCT Filed: Oct. 21, 2019

(86) PCT No.: PCT/IT2019/050223
§ 371 (c)(1),
(2) Date: Apr. 16, 2021

(87) PCT Pub. No.: WO2020/079718
PCT Pub. Date: Apr. 23, 2020

(65) Prior Publication Data
US 2021/0379401 A1    Dec. 9, 2021

(30) Foreign Application Priority Data
Oct. 19, 2018    (IT) .................. 102018000009640

(51) Int. Cl.
A61N 5/06    (2006.01)

(52) U.S. Cl.
CPC ......... *A61N 5/0625* (2013.01); *A61N 5/0616* (2013.01); *A61N 5/0622* (2013.01);
(Continued)

(58) Field of Classification Search
CPC .. A61N 5/0625; A61N 5/0616; A61N 5/0622; A61N 2005/0648;
(Continued)

(56) References Cited
U.S. PATENT DOCUMENTS

2005/0234383 A1* 10/2005 Dougal .................... A61N 5/06
604/5.02
2012/0172951 A1   7/2012 Choi
(Continued)

FOREIGN PATENT DOCUMENTS

WO    2013003594 A2    1/2013
WO    2014018640 A1    1/2014
(Continued)

OTHER PUBLICATIONS

Definition of Mask. The Britannica Dictionary, retrieved on Mar. 20, 2024; Retrieved from the Internet: < https://www.britannica.com/dictionary/mask> (Year: 2024).*

Primary Examiner — Niketa Patel
Assistant Examiner — Sebastian X Lukjan
(74) Attorney, Agent, or Firm — McGlew and Tuttle, P.C.

(57) ABSTRACT

The device for stimulating the Meibomian glands comprises a cap (2) and a plurality of light-emitting diodes (3) arranged on the inner surface of said cap (2). The light emitting diodes (3) are electrically connected to an external control and/or supply unit (4), provided with a control interface (6). The cap (2) comprises at least one matrix (30) of light-emitting diodes (3) arranged in areas of the inner surface of the cap (2) suitable for facing, in use, the eyelids and the periocular areas of the user.

19 Claims, 3 Drawing Sheets

(52) U.S. Cl.
CPC ............... *A61N 2005/0648* (2013.01); *A61N 2005/0652* (2013.01); *A61N 2005/0658* (2013.01)

(58) Field of Classification Search
CPC .... A61N 2005/0652; A61N 2005/0658; A61N 2005/0662; A61N 1/403; A61F 9/04; A61F 9/008
See application file for complete search history.

(56) References Cited

U.S. PATENT DOCUMENTS

| | | |
|---|---|---|
| 2013/0110101 A1 | 5/2013 | Van Valen et al. |
| 2014/0363064 A1* | 12/2014 | Lee .................. G06T 7/0012 382/128 |
| 2016/0067087 A1* | 3/2016 | Tedford ............. A61N 5/0624 606/4 |
| 2017/0014300 A1 | 1/2017 | Dippo et al. |

FOREIGN PATENT DOCUMENTS

| | | |
|---|---|---|
| WO | 2016070134 A1 | 5/2016 |
| WO | 2016080338 A1 | 5/2016 |

* cited by examiner

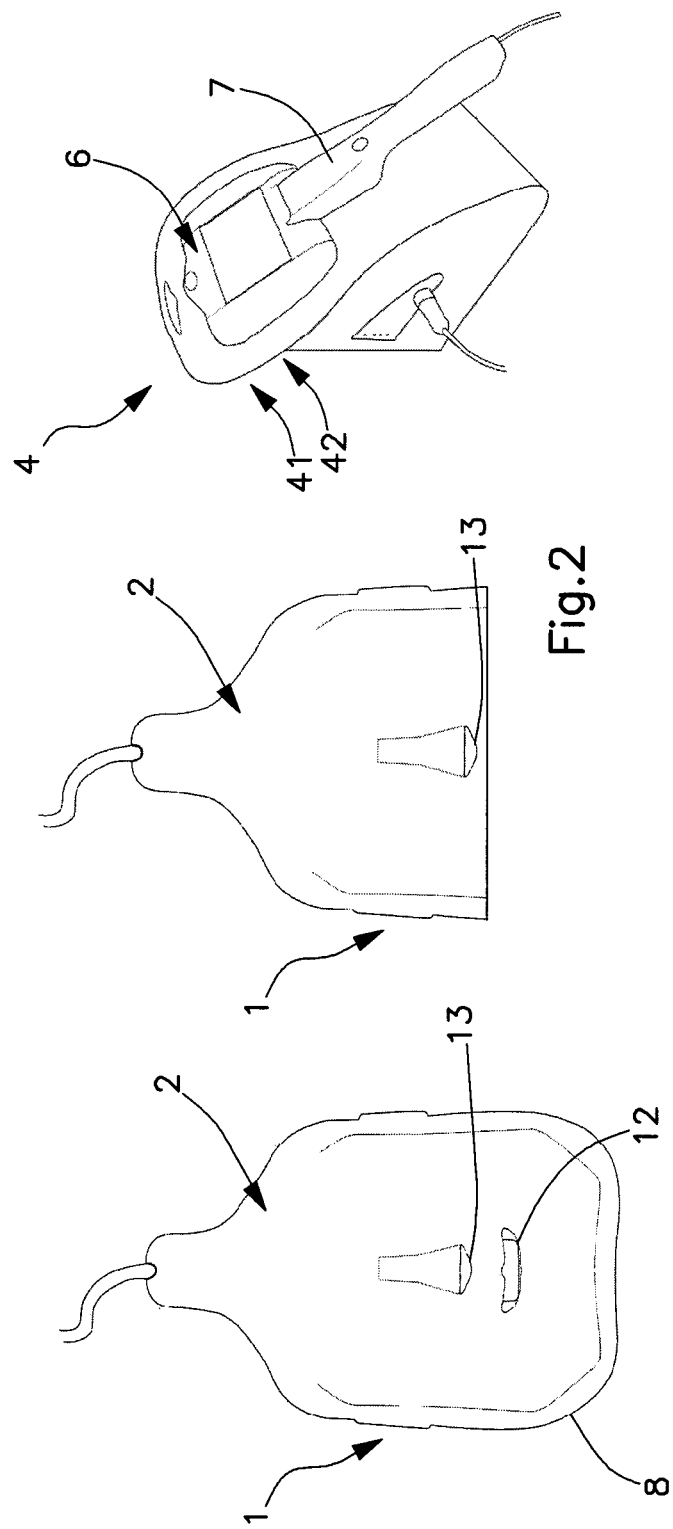

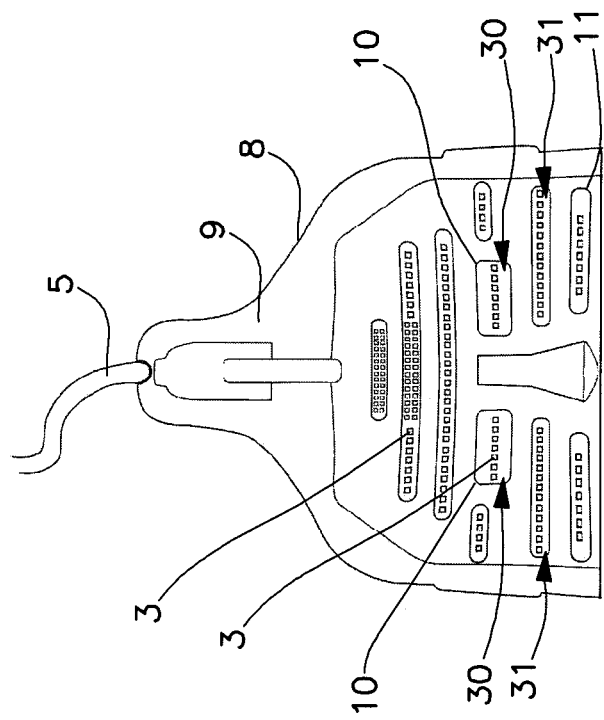
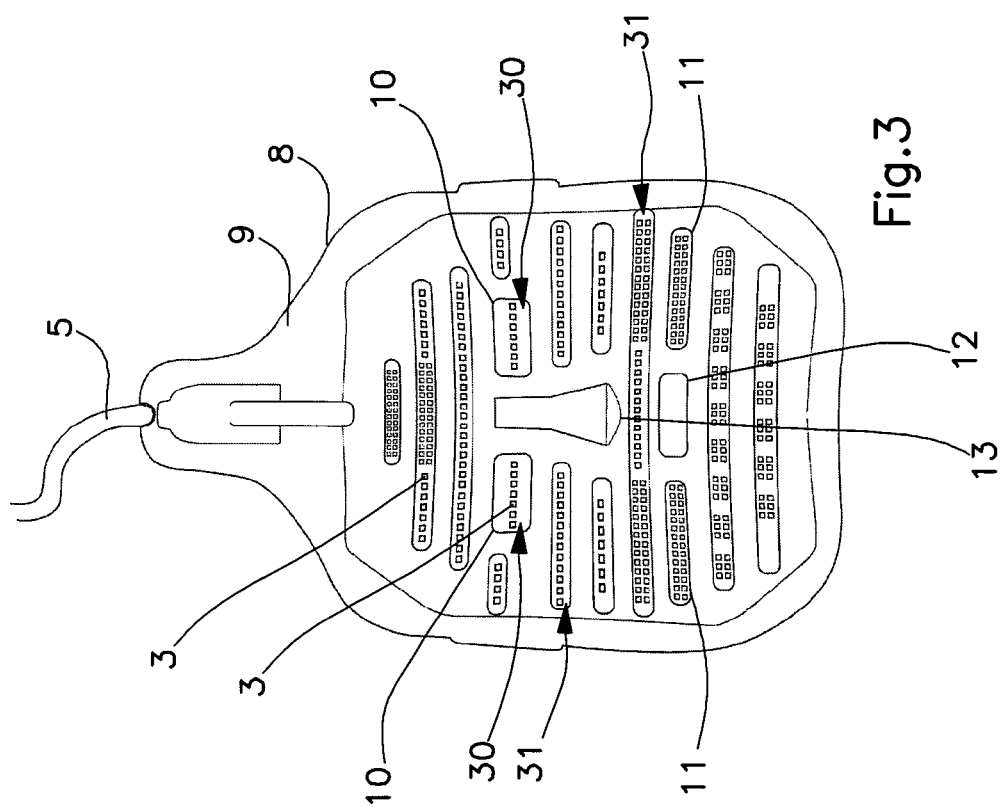

DEVICE FOR STIMULATING THE MEIBOMIAN GLANDS

TECHNICAL FIELD

The present invention relates to a device for stimulating the Meibomian glands.

PRIOR ART

Numerous types of pathologies are known that affect the eyelids and cause chronic inflammatory states in the periorbital region, often associated with abnormal tear production. Some examples of these pathologies are blepharitis, chalazion, stye, meibomianitis.

The alteration of lacrimal production, whether it is a reduced production of tears or excessive tear evaporation, is the basis of the so-called dry eye syndrome.

The dry eye is an eye disease which consists of a quantitative reduction or a qualitative alteration of the tear film and is characterised by symptoms such as redness, burning, photophobia, feeling of the presence of a foreign body in the eye and, in the most severe cases, eye pain and blurred vision. Dry eye syndrome, in Italy, affects about 26% of the adult population, with a prevalence among women after age 40 (50%) and those in menopause (90%).

One of the main causes of dry eye syndrome is the dysfunction of the Meibomian glands, which are inside the eyelids and are involved in the production of the lipid component of the tear film.

The tear film is in fact made of three main components: the mucous part which is responsible for the correct distribution of tears on the ocular surface; the aqueous part, that is the intermediate and predominant part, produced mainly by the lacrimal glands; and the lipid part, that is the superficial part, whose functions are to prevent the tear film from coming out, to maintain a good hydration during sleep and to regulate the evaporation of the film.

A dysfunction of the Meibomian glands involves an alteration of the lipid layer which causes the appearance of a dry eye with its characteristic symptoms.

To remedy this problem, various treatments of eyelid diseases, in particular dry eye syndrome, have been proposed.

A first solution involves the use of artificial drops that aim to replace the natural tear film but, on the other hand, only enable the symptoms and not the causes of the pathology to be treated.

Other solutions, instead, act on the causes of the pathology and provides, according to a known modality, for the use of the heat, sometimes combined with a mechanical action, which produces a beneficial effect in terms of facilitating the secretion of the lipid component by the Meibomian glands in the event of any obstruction of the glands themselves.

Patent application WO 2013/003594 describes, for example, an apparatus for treating obstructions of the Meibomian glands, which provides at least one RF electrode arranged near the surface of the eyelid to selectively convey radio-frequency radiation towards the glands, more precisely towards the obstructed ducts of the glands, so as to transfer the heat necessary to cause the dissolution or fluidification of the material that obstructs the ducts. The apparatus also comprises compression means suitable for exerting force on the eyelids or directly on the obstructed ducts to facilitate, in cooperation or as an alternative to the RF electrode, the removal of the occlusion. Such compression means may comprise a needle, a jet of a fluid such as water or air, a laser.

Patent application WO 2016/070134 describes an apparatus for treating Meibomian glands dysfunctions, which includes a heating element capable of conveying the heat towards the eyelid tissue, which includes the glands, and towards the tissue adjacent to the area where the glands are located. The apparatus provides for a plate suitable to be interposed between the eyeball and the inner surface of the respective eyelid, connected to a compression member dimensioned to be positioned adjacent to an outer surface of the eyelid so that, together with the plate, a force of compression is exerted on the eyelid. The plate is associated with the compression member through a pair of arms.

It should however be noted that the treatments that can be carried out by means of the apparatuses described above require a high precision of execution, in addition to being relatively complex. Furthermore, these are rather invasive solutions which generally require an anaesthesia on the patient for their implementation.

Solutions have therefore been developed that provide for a smaller degree of invasiveness. Patent application US 2017/0014300 illustrates, for example, a mask suitable for being arranged on the user's face by means of a suitable coupling device. The mask comprises a pair of heating members and miniaturised resonant frequency vibration generators, both arranged at the eyelids and at the periorbital region, so that heat and vibrational energy are transferred to the eyelids, respectively. The heating members are made by resistors or metal wires weaved into the mask weft and both function as converters of electrical energy into thermal energy and as conductors of vibrations. The coupling device, which is interposed between the mask and the surface of the skin, preferably comprises a composition based on a hydrogel contained in a support structure. The mask is provided with a USB port suitable for guaranteeing the connection by wired means to a power supply and control unit.

A disadvantageous aspect of the mask described is the need to ensure a coupling between the mask and the surface of the skin to be treated by means of a layer of hydrogel or another material so that it may function effectively and safely.

A further known solution is represented by the ocular mask marketed with the name Eyegiene® which provides for a direct application on the eyelid region. Some heating units are inserted in the mask that develop a temporary therapeutic heat. However, it has been observed that the beneficial effects of the treatment using this mask do not have an optimal duration.

A further solution for treating dry eye syndrome is illustrated in patent application WO 2014/018640. The application describes a device comprising a shaped body, which is associated with the user's face, in use, and comprises a plurality of diodes configured to emit a beam of electromagnetic radiation in the area of the eyelids and periocular regions of the user.

Despite the developed solutions, there remains the need to devise a device that enables the dysfunctions of the Meibomian glands to be treated.

DISCLOSURE

An object of the present invention is to solve the above problems by devising a device which enables the treatment of the dysfunctions of the Meibomian glands to be performed in an optimal manner.

Within this object, a further object of the present invention is to devise a device which enables an effective treatment of the dysfunctions of the Meibomian glands to be carry out.

A further object of the present invention is to provide a device which facilitates the preparation of the treatment of the dysfunctions of the Meibomian glands.

A further object of the invention is to provide a device for stimulating the Meibomian glands, which has a simple constructive and functional conception, provided with surely reliable operation, versatile use, as well as relatively economic cost.

The aforementioned objects are achieved, according to the present invention, by the device for stimulating the Meibomian glands according to claim 1, by the computer program according to claim 8 and by the readable memory according to claim 13.

The device for stimulating the Meibomian glands comprises a mask provided with a matrix of light-emitting diodes arranged in areas of the inner surface of the same mask suitable for facing, in use, the eyelids and the periocular areas of the user, in order to generate an endogenous heat, said light-emitting diodes being configured to emit a beam of electromagnetic radiation in the range of wavelengths ranging from 600 nm to 650 nm, said light-emitting diodes being also configured to emit a beam of electromagnetic radiation at an emission power ranging between 60 $mW/cm^2$ and 120 $mW/cm^2$. In fact, it has been observed clinically that the combination of the features relating to the wavelength and to the emission power of the radiation beam emitted by the LEDs of the matrices arranged at the eye area produces the effect of effectively stimulating Meibomian glands.

Said light emitting diodes are electrically connected to an external control and/or supply unit.

Advantageously, said external control and/or supply unit is provided with a control interface.

Said external control and/or supply unit comprises an electronic processor and a memory that can be read by an electronic processor.

Said memory comprises instructions which, when carried out by said electronic processor, cause said electronic processor, on the basis of data relating to a severity level of the dysfunction of the Meibomian glands of the user, to calculate the optimal amount of energy that must be absorbed by the user's Meibomian glands to stimulate them and, based on said calculated energy, to automatically select a plurality of said light-emitting diodes and automatically set their power and emission duration. The control unit is therefore configured to automatically calculate the energy that must be absorbed by the Meibomian glands, on the basis of the severity of the same glands dysfunction. In this way the efficacy and reliability of the treatment is increased, considering that the parameters of the light-emitting diodes are automatically set in a specific way for a predetermined level of severity of the dysfunction of the Meibomian glands.

A further advantage introduced by the device is that it allows an easy operation since the operator does not calculate the treatment parameters but the calculation is made automatically by the control unit on the basis of the information relating to the level of severity of the dysfunction. This allows the use of the device to be facilitated also because it does not require the operator to be trained to calculate the value of the diode parameters.

The simplification of the treatment setting also allows the operating times to be reduced. A further factor that reduces the operating times is the fact that a particular preparation of the user is not required before the carrying out of the treatment.

Advantageously, said data relating to a severity level of the Meibomian glands dysfunction are set by the operator through said control interface. The operator may therefore select only the severity level of the dysfunction to be treated and the setting of the aforementioned parameters is carried out automatically by the control unit.

Advantageously, said interface consists of a touch screen or a screen associated with suitable control buttons.

Preferably, said light-emitting diodes are configured to emit a beam of electromagnetic radiation at an emission power ranging between 110 $mW/cm^2$ and 120 $mW/cm^2$.

Preferably, said light-emitting diodes are configured to emit a beam of electromagnetic radiation at an emission power ranging between 115 $mW/cm^2$ and 120 $mW/cm^2$.

Preferably, said mask has a solid eye area so as to house said light-emitting diode matrix.

Advantageously, said light-emitting diodes are arranged substantially at the same distance from the user's eyelids.

Preferably, said light-emitting diodes are arranged, in use, at a distance from 5 mm to 200 mm from the area to be treated. The characteristic relative to the distance of the light-emitting diodes is important in order to obtain an effective treatment since it is connected to the dispersion of the emitted energy.

Advantageously, said mask has further solid areas at different areas of the face, such as, for example, the forehead and/or the cheeks, so as to house further matrices of light-emitting diodes suitable for being used to perform therapeutic treatments on the skin.

Preferably, said light-emitting diodes of said further matrices are configured to emit a beam of electromagnetic radiation at a power in the range of 80 $mW/cm^2$ to 150 $mW/cm^2$.

Preferably, said light-emitting diodes of said further matrices are configured to emit a beam of electromagnetic radiation at a power between 90 $mW/cm^2$ and 150 $mW/cm^2$.

According to an aspect of the invention, the light-emitting diodes arranged at the eye area emit a beam of electromagnetic radiation at a power level of substantially 30% higher than the emission power of the light-emitting diodes of the further matrices in different areas of the face.

Advantageously, said at least one matrix at the eye area has a greater number of light-emitting diodes per surface unit than the number of light-emitting diodes per surface unit of said further matrices.

Preferably the light-emitting diodes of said at least one matrix at the eye area are smaller than those of the light-emitting diodes which constitute the further matrices.

Advantageously, said mask is associated with support means capable of maintaining the same mask, in use, in a prearranged position in front of the user's face.

Preferably, said mask is made from a laminar body of polymeric material.

Preferably said laminar body of the mask comprises an outer layer and an inner layer which is suitable for housing said light-emitting diodes in the thickness, said outer layer and said inner layer being made firmly integral with one another.

Preferably, said inner layer of the mask's laminar body has a pair of openings at the eyelids and at the periocular areas of the user, so that respective matrices of said light-emitting diodes are housed.

Said openings of the inner layer of the laminar body are closed at the bottom by said outer layer of the laminar body.

Preferably, said light-emitting diodes are connected to respective electrical supply circuits incorporated between said outer layer and said inner layer of the laminar body of the mask.

The object of the invention is also a computer program comprising instructions that cause the device to perform the steps of setting data relating to a severity level of the dysfunction of the user's Meibomian glands to be treated; storing said data; on the basis of said acquired and stored data, calculate the amount of energy that must be absorbed by the Meibomian glands to cause their stimulation and, based on said amount of energy calculated, automatically selecting a plurality of said light-emitting diodes and setting automatically the power and duration of the emission; activating said plurality of said light-emitting diodes for the set emission duration, in order to stimulate the user's Meibomian glands. It should be noted that the computer program according to the present invention allows the treatment parameters to be calculated automatically, ensuring greater reliability of the device as well as reducing the operating times required to prepare the treatment.

Preferably the step of setting said data relating to a severity level of the Meibomian glands dysfunction provides for an operator to select said data via said control interface.

Preferably, before the step of setting said data relating to a severity level of the Meibomian glands dysfunction, there is the step of verifying that said device is positioned at a predetermined distance from the area to be treated, in particular from the eyelids. It should be noted that the positioning of the diodes at a predetermined distance from the area to be treated allows the energy dispersion to be minimised and, therefore, the effectiveness of the treatment to be increased.

Preferably, said emission duration is between 5 and 20 minutes.

Even more preferably said emission duration is equal to 15 minutes.

Advantageously, said step of actuating said light-emitting diodes for the set emission duration provides for emitting a beam of electromagnetic radiation continuously for a first interval of time and for emitting a beam of electromagnetic radiation in a pulsed manner for a second interval of time, the sum of said first time interval and said second time interval being corresponding to said set emission duration.

It has been observed clinically that the emission of electromagnetic radiation continuously, for the first time interval and, in a pulsed manner, for the second time interval of the emission duration, contributes to increasing the effectiveness of the treatment.

Preferably said second time interval is 10% of the duration of emission.

Also the object of the invention is a memory that can be read by an electronic processor, in which the above computer program is loaded.

BRIEF DESCRIPTION OF THE DRAWINGS

The details of the invention will become more evident from the detailed description of a preferred embodiment of the device for stimulating the Meibomian glands according to the invention, illustrated by way of example in the accompanying drawings, where:

FIG. 1 shows a front view of the device according to the present invention;

FIG. 2 shows a front view of the device according to a different embodiment;

FIG. 3 shows a view of the inner surface of the device, facing, in use, towards the face of the user;

FIG. 4 shows a view of the inner surface of the device according to a different embodiment, facing, in use, towards the face of the user;

FIG. 6 shows a control and/or supply unit suitable of being associated with the device in question.

BEST MODE

Figure 5:
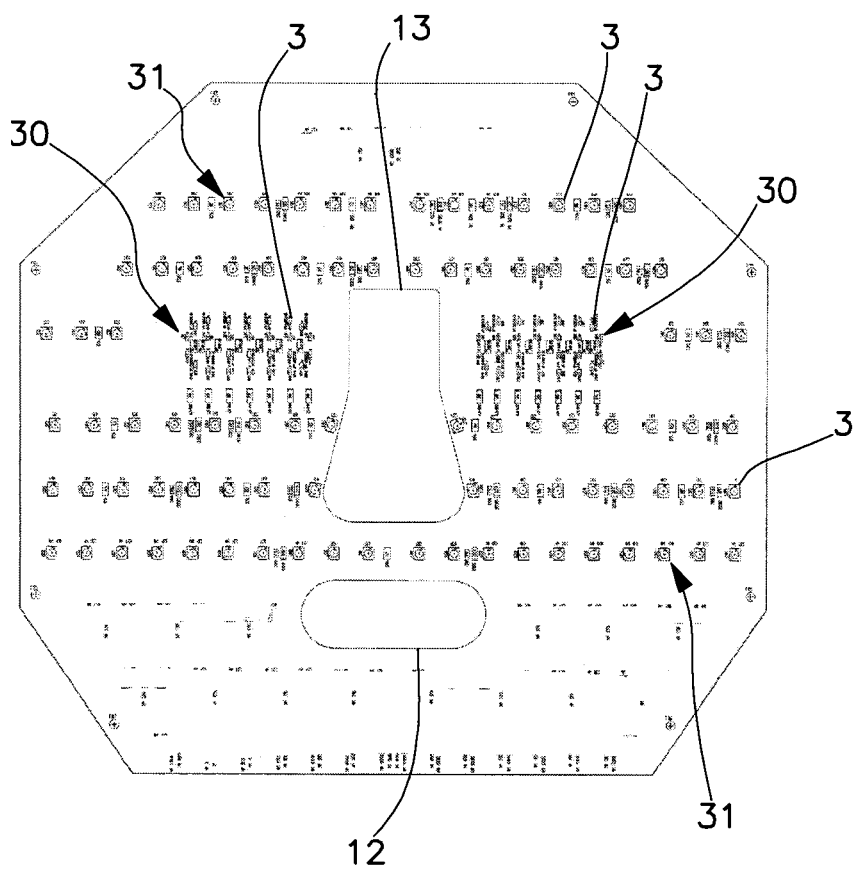
FIG. 5 shows a front view of an enlarged detail of the inner surface of the device shown in FIG. 3, in which the light-emitting diodes associated with the device are more visible.

With particular reference to these figures, the reference numeral 1 indicates the device for treating the eyelids and the periocular areas, in particular for stimulating the Meibomian glands according to the present invention.

The device 1 is made up of a cap 2 preferably having the shape of an anthropomorphic mask. This mask 2 is shaped by a laminar body incorporating a plurality of light sources 3 of the type of light-emitting diodes, for simplicity usually indicated by the acronym LED.

The mask 2 is associated with suitable support means, not visible in the figures, suitable for maintaining, in use, the same mask in a predetermined position in front of the user's face.

The LEDs 3 are connected to special electric circuits, known per se and therefore not shown, which allow the power supply and the correct operation of the diodes to be managed. The circuits of the LEDs 3 are electrically connected to a unit 4 for controlling and/or supplying the device. The control and/or supply unit 4 is arranged externally with respect to the mask 2 and is connected to it by means of a specific connection cable 5.

The control unit 4 comprises a control interface 6 suitable of easy setting the data relating to the dysfunction of the Meibomian glands or of the parameters that characterise the treatment, such as for example the duration of the treatment or the selection of the diodes to be activated, depending on the type of treatment desired, as will be explained further below.

The interface 6 may consist of a touch screen or a screen associated with suitable control buttons.

Alternatively it is possible to provide that the control interface which sets the treatment parameters is integrated within the mask 2.

The external control and/or supply unit 4 comprises an electronic processor 41 and a memory 42 which can be read by an electronic processor.

The memory 42 comprises instructions which, when performed by the electronic processor 41, cause the electronic processor 41 to automatically select a plurality of light-emitting diodes 3 and automatically set the power and duration of the emission, based on the amount of energy that must be absorbed by the Meibomian glands in order to cause stimulation of the user's Meibomian glands.

In particular, the memory 42 can comprise instructions which, when carried out by the electronic processor 41, cause the electronic processor 41, as a function of data set by the operator through the control interface 6 relating to a level of gravity of the dysfunction of the Meibomian glands, automatically select a plurality of said light-emitting diodes 3 and automatically set their power and duration of emission in order to cause stimulation of the user's Meibomian glands.

According to an embodiment of the invention, the control unit 4 is provided with a handpiece 7 housing a suitable neuronal stimulation means, capable of inducing muscular contractions which increase the action of the LEDs. Such neuronal stimulation means may be composed for example of RF, pulsed light, heat emitters and the like.

For example, such stimulation means may be composed of a polychromatic light, which, if applied on the periorbital areas and the cheekbones, thanks to thermal impulses, stimulates the contraction of the Meibomian glands increasing the lipid flow and reducing the evaporation of tears.

Thanks to the synergy of the LEDs 3 and of the stimulation means housed in the handpiece 7, the Meibomian glands continue to produce the lipids necessary for the functionality of the eye. The tests carried out showed that after a few hours from the treatment an improvement in the functionality of the Meibomian glands can be appreciated.

In a different embodiment, it is possible to provide that the circuits of the LEDs 3 are connected to a controller associated with the mask 2 and suitable for managing the operation of the LEDs 3, and that the external unit 4 is used solely to electrically supply the LEDs 3.

The laminar body of the mask 2 has a thickness appropriate for inserting the LEDs 3 and the relative circuits. The LEDs are arranged on the inner surface of the mask 2, facing in use towards the user's face. In particular, the LEDs 3 are arranged so that they shape at least one matrix 30 in the areas of the inner surface of the mask 2 which face, in use, the eyelids and the periocular areas of the user.

The laminar body of the mask 2 is preferably made of polymeric material. Alternatively, it is possible to provide that the mask 2 is made of other appropriate materials such as leather, fabric and/or paper derivatives.

The mask 2 has the solid eye area so as to house the aforementioned matrix 30 of the LEDs 3. More specifically, for each eye a zone suitable for housing a respective matrix 30 of the LEDs 3 is obtained in the mask 2. In this way the matrices 30 of the LEDs 3 may be used for treating pathologies involving the eyelids and the periocular areas. More specifically, the matrices 30 are sized so that the upper and lower eyelids of the user are irradiated, as well as the periocular areas.

Preferably the LEDs 3 are regularly arranged on the mask 2 at the eye area. In particular, in each row of the matrices 30, the LEDs 3 are arranged at the same distance from one another.

The mask 2 may also have, in other regions, for example, at different parts of the face such as the forehead and/or the cheeks, further matrices 31 of the LEDs 3 suitable for being used to perform appropriate therapeutic treatments on the skin.

The matrices 30 arranged at the eye area comprise a number of LEDs 3 per surface unit greater than the number of LEDs 3 per surface unit of the further matrices 31.

Preferably the LEDs 3 of the matrices 30 are smaller than those of the LEDs 3 which form the further matrices 31 (see FIG. 5).

According to a preferred embodiment, the laminar body of the mask 2 consists of a first external layer 8 and a second inner layer 9, made integral with one another.

The LEDs 3 and the relative circuits are housed in the thickness of the second inner layer 9. The second inner layer 9 has a pair of openings 10 at the eye area so that the matrices 30 of the LEDs 3 are exposed towards the eyelids and the periocular areas.

Preferably the openings 10 are oval-shaped so as to define respective solid areas of a shape suitable for irradiating, through the LEDs 3 of the matrices 30, the entire surface of the upper and lower eyelids together with the periocular areas.

A series of further openings 10 are also made on the second inner layer 9, preferably shaped into strips, capable of housing the further matrices 31 of the LEDs 3. The strips have different lengths depending on the region of the mask in which they are made, and they are arranged in sequence one after the other along a longitudinal direction of the mask.

Openings 12, 13 passing through the first layer 8 and the second layer 9 are made on the mask, preferably at the mouth and at the nose, so that a suitable circulation of air is ensured to the user and therefore his well-being is increased during the treatment.

The LEDs 3 are arranged on the mask 2 substantially at the same distance from the user's eyelids, in order to generate an endogenous heat. The distance is appropriately calculated on the basis of the characteristics of the intensity and frequency of the light beam emitted by the LEDs 3.

Preferably the LEDs 3 are arranged, in use, at a distance from the area to be treated of between 5 mm and 200 mm.

The LEDs 3 arranged at various areas of the face, different from the eye area, i.e. the LEDs 3 which constitute the matrices 31, may have different characteristics, for example they may be suitable for emitting a red light beam to stimulate the production of collagen, or a blue beam to counteract bacterial acne or a yellow beam to stimulate the lymphatic system and the nervous system, or even an infrared beam. Preferably LEDs 3 having different characteristics are combined in the same mask 2 to carry out a variety of treatments.

The LEDs 3 of the matrices 30 at the eye area are configured to emit a beam of electromagnetic radiation having a wavelength between 600 nm and 650 nm.

In fact, it has been observed experimentally that the radiations having a wavelength within the specified range may penetrate the layers of the skin such as the epidermis, the dermis, and, at least in part, the adipose tissue, to reach the Meibomian glands.

The LEDs 3 of the matrices 30 are configured to emit a beam of electromagnetic radiation at an emission power greater than or equal to 110 mW/cm$^2$.

Preferably the LEDs 3 of the matrices 30 are configured to emit a beam of electromagnetic radiation at an emission power of between 60 mW/cm$^2$ and 120 mW/cm$^2$.

Even more preferably, the LEDs 3 are configured to emit a beam of electromagnetic radiation at a power of between 110 mW/cm$^2$ and 120 mW/cm$^2$, preferably between 115 mW/cm$^2$ and 120 mW/cm$^2$.

The clinical trials carried out have shown that the use of the matrices 30 of the LED 3 which emit electromagnetic radiations having a wavelength between 600 nm and 650 nm and an emission power of between 60 mW/cm$^2$ and 120 mW/cm$^2$ effectively stimulate the Meibomian glands so as to treat the dysfunctions of the Meibomian glands.

The beam of electromagnetic radiation presenting the mentioned wavelength and emitted power characteristics is able to reach the Meibomian glands and to trigger the physiological mechanisms underlying the restoration of the Meibomian gland function.

The LEDs 3 of the further matrices 31 are configured to emit a beam of electromagnetic radiation at a power greater than or equal to 80 mW/cm$^2$.

Preferably the LEDs 3 of the further matrices 31 are configured to emit a beam of electromagnetic radiation at a power of between 80 mW/cm$^2$ and 150 mW/cm$^2$.

Even more preferably, the LEDs 3 of the further matrices 31 are configured to emit a beam of electromagnetic radiation at a power of between 90 mW/cm$^2$ and 150 mW/cm$^2$.

According to an aspect of the invention, the LEDs 3 of the matrices 30 emit a beam of electromagnetic radiation at a power level substantially 30% higher than the emission power of the LEDs 3 of the further matrices 31.

It is possible to foresee that the surfaces of the LEDs 3 facing the skin to be treated are covered by a special filter capable of removing any possible frequency, which may be potentially dangerous, present in the LED 3 emission spectrum.

The operation of the device for treating the Meibomian glands is easy to understand from the above description.

First, the mask 2 is arranged in front of the user's face by means of a suitable support means. The mask 2 is positioned at a predetermined distance from the user's face so as to minimise the energy dispersion.

The operator sets through the interface 6 of the control and/or supply unit 4 the data relating to a severity level of the dysfunction of the Meibomian glands of the user that must be treated.

Preferably these data are related to the severity level of the pathology of the Meibomian glands.

The severity level of the pathology is established according to a reference evaluation scale that is stored in the device.

Preferably the evaluation scale used is the scale of Heiko Pult.

Once the severity level of the pathology of the Meibomian glands is selected, the program executed by the electronic processor 41 allows the optimal energy quantity that the Meibomian glands must absorb in order to be stimulated to be automatically calculated.

On the basis of the amount of energy calculated, the program selects the LEDs 3 arranged at the eye area, in particular the eyelids and the periocular areas, and calculates the values relating to the emission power and to the emission duration of the LEDs 3 which are suitable for the treatment to be carried out.

The electromagnetic radiations emitted by the LEDs 3 interact with predetermined organelles of the irradiated tissue cells, activating the production of ATP (adenosine triphosphate) which is associated with the production of thermal energy. In particular, the light beams emitted by the LEDs 3 stimulate the production of endogenous heat which has a beneficial effect on the dysfunctions of the Meibomian glands, in particular on any present obstruction as it allows the material that occludes the glands to be fludified.

Following the calculation of the values of the treatment parameters, the operator turns on the device and activates the LEDs 3.

The user is then subjected to treatment for a predetermined time interval which corresponds to the emission duration $\Delta t$.

It has been observed experimentally that a preferred treatment time interval is between 5 and 20 minutes, preferably 15 minutes.

The step of actuating the LEDs 3 provides for actuating the LEDs 3 so that they emit a beam of electromagnetic radiation continuously for a first time interval $\Delta t1$. Then, the LEDs 3 are operated so that they emit a beam of electromagnetic radiation in a pulsed manner for a second time interval $\Delta t2$.

The sum of the first time interval $\Delta t1$ and the second time interval $\Delta t2$ corresponds to the predetermined emission duration $\Delta t$.

Preferably the second time interval $\Delta t2$ is 10% of the emission duration $\Delta t$.

In the case where a variety of treatments is carried out, for example a treatment of the eye area together with a therapeutic treatment of other areas of the face, the further matrices 31 of LEDs 3 arranged at the regions concerned are also activated.

In the case of a variety of treatments, the operator selects, through the interface 6 of the control and/or supply unit 4, the further LEDs 3 of interest and enters the values of the parameters suitable for the type of treatment, for example the duration and the emission power.

The treatment performed by the LEDs 3 can be associated with the action of appropriate neuronal stimulators, such as RF, pulsed light, heat emitters and the like, in order to induce muscle contractions that increase the action of the LEDs. This second treatment is suitably carried out by means of the handpiece 7 of the control and/or supply unit 4.

The device according to the present invention achieves the purpose of allowing an effective treatment of the dysfunctions of the Meibomian glands to be carried out.

It has in fact been observed clinically that the combination of the characteristics relating to the wavelength and to the emission power of the radiation beam emitted by the LEDs of the matrices arranged at the eye area produces the effect of effectively stimulating the Meibomian glands. More specifically, a beam of electromagnetic radiations presenting a wavelength between 600 nm and 650 nm and an emission power of between 60 mW/cm$^2$ and 120 mW/cm$^2$ has been selected from the clinical trials.

Another aspect to underline is the fact that the setting of the treatment parameters is facilitated since the program executed by the processor, based on the data relating to the severity level of the dysfunction, automatically calculates the parameters, that is the emission power and the duration of emission, and selects the wavelength of radiation through the choice of the LEDs to be activated. Therefore, the operator only indicates the severity level of the Meibomian glands dysfunction and the parameters are set automatically.

The simplification of the treatment setting also allows the operating times to be reduced. A further factor which reduces the operating times is the fact that a particular preparation of the user for the treatment is not required. This aspect also greatly reduces the risks associated with preparations sometimes implemented such as anesthesia.

It should be emphasised that the automatic calculation of the treatment parameters, made on the basis of energy that the Meibomian glands must absorb, also guarantees greater reliability of the treatment.

Furthermore, it is pointed out that it has been clinically observed that the emission of electromagnetic radiations in a continuous manner for the first time interval, and in a pulsed manner, for the second time interval of the emission duration, contributes to increasing the effectiveness of the treatment.

Finally, it is noted that the device is non-invasive and safe because the mask is arranged in front of the user's face, at a suitable distance, therefore the user is irradiated by the LEDs light beam without the need to contact directly the user's skin with the energy source. It should be emphasised that the heat used for the treatment is endogenous, so the thermal energy is not applied on the user's skin from the outside, thus any risks associated with exposure to heat is eliminated.

The device is also simple in structure and is not difficult to manage, therefore highly specialised training of the operator is not required.

The device for treating the skin described by way of example may be modified according to the different needs. In particular, the cap may be made in a different manner than as previously illustrated, for example with limited dimensions so as to substantially cover only the eyelids and the periocular areas, as illustrated in FIGS. 2 and 4.

In the practical embodiment of the invention, the materials used, as well as the shape and the dimensions, may be modified according to the needs.

Should the technical features mentioned in any claim be followed by reference signs, such reference signs were included strictly with the aim of enhancing the understanding of the claims and hence they shall not be deemed restrictive in any manner whatsoever on the scope of each element identified for exemplifying purposes by such reference signs.

The invention claimed is:

1. A device for stimulating the Meibomian glands of a user, the device comprising:
   a cap;
   a plurality of light-emitting diodes arranged on an internal surface of said cap, said plurality of light-emitting diodes comprising at least one matrix of light-emitting diodes arranged in areas of said inner surface of the cap suitable for facing, in use, eyelids and periocular areas of the user, said light-emitting diodes being arranged substantially at a same distance from the user's eyelids, to generate endogenous heat, wherein said cap comprises a mask, the mask having further solid areas at different areas of the face housing further matrices of light-emitting diodes suitable for being used to perform therapeutic treatments on the skin, the mask being configured, in a use state, to cover a forehead of the user and cheeks of the user; and
   an external control and/or supply unit electrically connected to said light-emitting diodes and provided with a control interface, wherein:
   said light-emitting diodes of said at least one matrix are configured to emit a beam of electromagnetic radiation in a range of wavelengths between 600 nm and 650 nm, said light-emitting diodes being configured to emit a beam of electromagnetic radiation at an emission power of between 60 mW/cm$^2$ and 120 mW/cm$^2$;
   parameters for operating said light-emitting diodes are set based on a Heiko Pult scale;
   said external control and/or supply unit comprises an electronic processor; a non-transitory memory readable by an electronic processor, comprising instructions which, when performed by said electronic processor, cause said electronic processor, on the basis of data relating to a severity level of the dysfunction of the Meibomian glands of the user, to calculate an optimal amount of energy that must be absorbed by the user's Meibomian glands to stimulate them, to automatically select a plurality of light-emitting diodes and to automatically set their power and duration of emission;
   said severity level of the dysfunction of the Meibomian glands is established according to a reference evaluation scale that is stored in said non-transitory memory of the device; and
   said light-emitting diodes are arranged, in use, at a distance from the area to be treated ranging from more than 5 mm to 200 mm.

2. Device according to claim 1, wherein said data relating to a severity level of the Meibomian glands dysfunction are set by an operator through said control interface, the reference evaluation scale being the Heiko Pult scale.

3. Device according to claim 1, wherein said light-emitting diodes are configured to emit a beam of electromagnetic radiation at an emission power greater than or equal to 110 mW/cm$^2$.

4. Device according to claim 1, wherein said light-emitting diodes of said at least one matrix are configured to emit a beam of electromagnetic radiation at an emission power level of substantially 30% higher than the emission power of said light-emitting diodes of said further matrices.

5. Device according to claim 1, wherein said light-emitting diodes of said further matrices are configured to emit another beam of electromagnetic radiation at an emission power of between 80 mW/cm$^2$ and 150 mW/cm$^2$, said light-emitting diodes of at least one of said further matrices being configured to emit said beam of electromagnetic radiation to said forehead of said user, said light-emitting diodes of at least another one of said further matrices being configured to emit yet another of electromagnetic radiation to one of said cheeks of said user.

6. Device according to claim 1, wherein said further matrices of light-emitting diodes and said at least one matrix of light-emitting diodes arranged in areas of said inner surface of said cap face in a same direction.

7. A process comprising:
   providing a device for stimulating the Meibomian glands of a user, the device comprising: a cap; a plurality of light-emitting diodes arranged on an internal surface of said cap, said plurality of light-emitting diodes comprising at least one matrix of light-emitting diodes arranged in areas of said inner surface of the cap suitable for facing, in use, eyelids and periocular areas of the user, said light-emitting diodes being arranged substantially at a same distance from the user's eyelids, to generate endogenous heat; an external control and/or supply unit electrically connected to said light-emitting diodes and provided with a control interface, wherein: said light-emitting diodes of said at least one matrix are configured to emit a beam of electromagnetic radiation in a range of wavelengths between 600 nm and 650 nm, said light-emitting diodes being configured to emit a beam of electromagnetic radiation at an emission power of between 60 mW/cm$^2$ and 120 mW/cm$^2$; and said external control and/or supply unit comprises an electronic processor with instructions which, when performed by said electronic processor, cause said electronic processor, on the basis of data relating to a severity level of the dysfunction of the Meibomian glands of the user, to calculate an optimal amount of energy that must be absorbed by the user's Meibomian glands to stimulate them, to automatically select a plurality of light-emitting diodes and to automatically set their power and duration of emission, said device comprising a non-transitory memory, said severity level of the dysfunction of the Meibomian glands being established according to a reference evaluation scale that is stored in said non-transitory memory of the device, said light-emitting diodes being arranged, in use, at a distance from the area to be treated ranging from more than 5 mm to 200 mm, wherein said cap comprises a mask, the mask having further solid areas at different areas of the face housing further matrices of light-emitting diodes suitable for being used to perform therapeutic treatments on the skin, said mask being configured, in a use state, to cover a forehead of the user and cheeks of the user;

providing a program loaded on the non-transitory memory, the program comprising the instructions which cause the device to perform the following steps:
a) setting, through said control interface, data relating to a severity level of the Meibomian glands dysfunction of the user;
b) storing said data;
c) calculating, on the basis of said acquired and stored data, an optimal amount of energy that said Meibomian glands must absorb to be stimulated;
d) automatically selecting a plurality of said light-emitting diodes and automatically setting the power and duration of emission on the basis of said calculated energy quantity; and
e) actuating said plurality of said light-emitting diodes for the set emission duration, in order to stimulate the user's Meibomian glands, wherein parameters for operating said light-emitting diodes are set based on a Heiko Pult scale.

8. A process according to claim 7, wherein the program provides, prior to step (a) of setting, by means of said control interface, data relating to a severity level of the dysfunction of the user's Meibomian glands, the step of verifying that said device is positioned at a predetermined distance from the area to be treated, said light-emitting diodes of at least one of said further matrices being configured to emit said beam of electromagnetic radiation to said forehead of said user, said light-emitting diodes of at least another one of said further matrices being configured to emit yet another of electromagnetic radiation beam to one of said cheeks of said user.

9. A process according to claim 7, wherein said emission duration is between 5 and 20 minutes.

10. A process according to claim 7, wherein said step e) of actuating said plurality of said light-emitting diodes for the set emission duration includes the steps of:
e1) emitting a beam of electromagnetic radiation continuously for a first time interval ($\Delta t1$) and,
e2) emitting a beam of electromagnetic radiation in a pulsed manner for a second time interval, the sum of said first time interval and said second time interval being corresponding to said set emission duration.

11. A process according to claim 10, wherein said second time interval is 10% of the emission duration.

12. A process according to claim 7, wherein the non-transitory memory is associated with the electronic processor and is readable by the electronic processor.

13. A device for stimulating the Meibomian glands of a user, the device comprising:
a cap comprising an inner cap surface;
light-emitting diodes arranged on said inner cap surface, said light-emitting diodes being arranged at a distance from an area to be treated ranging greater than 5 mm to 200 mm when said cap is applied to said user, said light-emitting diodes comprising at least one matrix of one or more of said light-emitting diodes arranged in areas of said inner cap surface, said light-emitting diodes being configured to face in a direction of eyelids and periocular areas of a user when said cap is applied to said user, each of said light-emitting diodes being configured to be located at a same distance from said eyelids of said user to generate endogenous heat when said cap is applied to said user, wherein said cap comprises a mask, said mask having further solid areas at different areas of said face housing further matrices of said light-emitting diodes suitable for being used to perform therapeutic treatments on said skin, said mask being configured, in a use state, to cover a forehead of the user and cheeks of the user; and
an external control and/or supply unit electrically connected to said light-emitting diodes, said external control and/or supply unit comprising a control interface, said one or more of light-emitting diodes of said at least one matrix being configured to emit a beam of electromagnetic radiation in a range of wavelengths between 600 nm and 650 nm, said light-emitting diodes being configured to emit a beam of electromagnetic radiation at an emission power of between 60 mW/cm$^2$ and 120 mW/cm$^2$, said external control and/or supply unit comprising an electronic processor and a non-transitory computer-readable memory readable by said electronic processor, said non-transitory computer-readably memory comprising a reference evaluation scale and instructions, said reference evaluation scale comprising a severity level scale of dysfunction of said Meibomian glands, said electronic processor being configured to carry out said instructions such that said electronic processor calculates an optimal amount of energy that must be absorbed by said Meibomian glands to stimulate said Meibomian glands based on said reference evaluation scale and said electronic processor automatically sets a power setting and duration of emission setting of a select amount of said light-emitting diodes to achieve said optimal amount of energy, wherein parameters for operating said led-emitting diodes are set based on a Heiko Pult scale.

14. The device according to claim 13, wherein data is provided as an input via said control interface to said electronic processor, said data relating to properties of said Meibomian glands dysfunction, wherein said severity level of said Meibomian glands dysfunction is determined by said electronic processor based on said data and said reference evaluation scale, said reference evaluation scale being the Heiko Pult scale.

15. The device according to claim 13, wherein said light-emitting diodes are configured to emit another beam of electromagnetic radiation at an emission power greater than or equal to 110 mW/cm$^2$.

16. The device according to claim 13, wherein said light-emitting diodes of said further matrices and said at least one matrix of one or more of said light-emitting diodes arranged in areas of said inner cap surface face in a same direction.

17. The device according to claim 16, wherein said light-emitting diodes of said at least one matrix are configured to emit another beam of electromagnetic radiation at an emission power level of substantially 30% higher than said emission power of said light-emitting diodes of said further matrices, said light-emitting diodes of said at least one matrix being configured to emit said another beam of electromagnetic radiation to said forehead of said user, said light-emitting diodes of at least another one of said further matrices being configured to emit yet another beam of electromagnetic radiation to one of said cheeks of said user.

18. The device according to claim 16, wherein said light-emitting diodes of said further matrices are configured to emit another beam of electromagnetic radiation at an emission power of between 80 mW/cm$^2$ and 150 mW/cm$^2$.

19. The device according to claim 13, wherein said electronic processor is configured to emit said beam of electromagnetic radiation continuously for a first time interval and, said electronic processor is configured to emit said beam of electromagnetic radiation in a pulsed manner for a second time interval, a sum of said first time interval and said second time interval being corresponding to said set emission duration, wherein said second time interval is ten percent of said emission duration.

\* \* \* \* \*